United States Patent
Shih et al.

(10) Patent No.: US 11,658,070 B2
(45) Date of Patent: May 23, 2023

(54) METHOD OF FORMING SEMICONDUCTOR STRUCTURE

(71) Applicant: NANYA TECHNOLOGY CORPORATION, New Taipei (TW)

(72) Inventors: Chiang-Lin Shih, New Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/643,182

(22) Filed: Dec. 8, 2021

(65) Prior Publication Data
US 2022/0093462 A1    Mar. 24, 2022

Related U.S. Application Data

(62) Division of application No. 17/022,051, filed on Sep. 15, 2020, now abandoned.

(51) Int. Cl.
| | | |
|---|---|---|
| *H01L 21/768* | (2006.01) | |
| *H01L 23/00* | (2006.01) | |
| *H01L 23/48* | (2006.01) | |

(52) U.S. Cl.
CPC .. *H01L 21/76898* (2013.01); *H01L 21/76831* (2013.01); *H01L 23/481* (2013.01); *H01L 24/32* (2013.01); *H01L 24/83* (2013.01); *H01L 2224/32057* (2013.01); *H01L 2224/32145* (2013.01); *H01L 2224/83896* (2013.01); *H01L 2224/83931* (2013.01)

(58) Field of Classification Search
CPC ............ H01L 21/768; H01L 21/76831; H01L 21/76898; H01L 23/00; H01L 23/48; H01L 23/481; H01L 24/32; H01L 24/83; H01L 2224/83931; H01L 2224/83896; H01L 2224/32145; H01L 2224/32057; H01L 21/76805; H01L 21/76832; H01L 21/76877; H01L 25/50; H01L 25/065; H01L 25/0657; H01L 2224/83; H01L 2224/94; H01L 2224/83193; H01L 2224/29186; H01L 2224/29023
USPC ......................................................... 438/597
See application file for complete search history.

(56) References Cited

U.S. PATENT DOCUMENTS

| | | |
|---|---|---|
| 2005/0034303 A1 | 2/2005 | Bonvalot |
| 2011/0042814 A1 | 2/2011 | Okuyama |
| 2012/0001329 A1 | 1/2012 | Kim et al. |
| 2013/0143360 A1 | 6/2013 | Wang |

(Continued)

*Primary Examiner* — Chuong A Luu
(74) *Attorney, Agent, or Firm* — CKC & Partners Co., LLC

(57) ABSTRACT

A method of forming a semiconductor structure includes following steps. A first wafer is bonded to a second wafer, in which the first wafer includes a first substrate and a first conductive pad above a first surface of the first substrate, and the second wafer comprises a second substrate and a second conductive pad above a second surface of the second substrate. A mask layer is formed above the first substrate. The mask layer and the first substrate are etched to form a first opening in the first substrate. A sacrificial spacer is formed in the first substrate at a sidewall of the first opening. The first conductive pad is etched to form a second opening communicated to the first opening. A conductive material is filled in the first opening and the second opening to form a conductive structure interconnecting the first and second conductive pads.

16 Claims, 12 Drawing Sheets

(56) References Cited

U.S. PATENT DOCUMENTS

| | | | |
|---|---|---|---|
| 2014/0264947 A1 | 9/2014 | Lin et al. | |
| 2015/0008540 A1 | 1/2015 | Chu et al. | |
| 2015/0340285 A1* | 11/2015 | Enquist | H01L 27/0688 |
| | | | 438/107 |
| 2016/0336231 A1* | 11/2016 | Tsai | H01L 21/76876 |
| 2018/0068984 A1 | 3/2018 | Beyne et al. | |
| 2019/0355621 A1* | 11/2019 | Marcadal | H01L 21/76834 |

* cited by examiner

METHOD OF FORMING SEMICONDUCTOR STRUCTURE

CROSS-REFERENCE TO RELATED APPLICATION

This application is a Divisional Application of the U.S. application Ser. No. 17/022,051, filed on Sep. 15, 2020, the entirety of which is incorporated by reference herein in their entireties.

BACKGROUND

Technical Field

The present disclosure relates to a method of forming a semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation.

As the number of electronic devices on single chips rapidly increases, three-dimensional (3D) integrated circuit layouts, or stacked chip designs, have been utilized for certain semiconductor devices in an effort to overcome the feature size and density limitations associated with 2D layouts. Generally, in a 3D IC design, two or more semiconductor dies are bonded together, and electrical connections are formed between each die. One method of facilitating the chip-to-chip electrical connections is by using through-silicon vias (TSVs). A TSV is a vertical electrical connection that passes through a silicon wafer, allowing for more simplified interconnection of vertically aligned electronic devices, thereby significantly reducing integrated circuit layout complexity as well as overall dimensions of a multi-chip circuit. Some of the benefits associated with the interconnect technology enabled by 3D IC designs include accelerated data exchange, reduced power consumption, and much higher input/output voltage densities.

SUMMARY

One aspect of the present disclosure is a method of forming a semiconductor structure.

According to some embodiments of the present disclosure, a method of forming a semiconductor structure includes following steps. A method of forming a semiconductor structure includes following steps. A first wafer is bonded to a second wafer, in which the first wafer includes a first substrate and a first conductive pad above a first surface of the first substrate, and the second wafer comprises a second substrate and a second conductive pad above a second surface of the second substrate. A mask layer is formed above the first substrate. The mask layer and the first substrate are etched to form a first opening in the first substrate, such that the first conductive pad is exposed through the first opening. A sacrificial spacer is formed in the first substrate at a sidewall of the first opening. The first conductive pad is etched by using the sacrificial spacer as an etching mask to form a second opening communicated to the first opening, such that the second conductive pad is exposed through the second opening. A conductive material is filled in the first opening and the second opening to form a conductive structure interconnecting the first conductive pad and the second conductive pad.

In some embodiments, the method of forming the semiconductor structure further includes prior to forming the mask layer, forming a passivation layer over the first substrate.

In some embodiments, the mask layer and the passivation layer includes different materials.

In some embodiments, the mask layer is made of metal oxide.

In some embodiments, forming the sacrificial spacer is performed such that the first conductive pad is exposed.

In some embodiments, forming the sacrificial spacer is performed such that a top portion of the sacrificial spacer has a width smaller than that of a bottom portion of the sacrificial spacer.

In some embodiments, forming the sacrificial spacer is performed such that the sacrificial spacer is in contact with the first conductive pad.

In some embodiments, forming the sacrificial spacer is performed such that the mask layer is spaced apart from the sacrificial spacer.

In some embodiments, the sacrificial spacer is made of an organic material.

In some embodiments, the semiconductor structure further includes removing the sacrificial spacer such that the sidewall of the first substrate is exposed prior to forming the conductive structure.

In some embodiments, etching the first conductive pad to form the second opening further includes etching a bonding layer between the first conductive pad and the second conductive pad.

In some embodiments, the semiconductor structure further includes forming a liner layer on a sidewall of the bonding layer.

In some embodiments, forming the conductive structure is performed such that a top portion of the conductive structure is in contact with the first conductive pad and a bottom portion of the conductive structure is in contact with the second conductive pad.

In some embodiments, the top portion of the conductive structure has a width greater than that of the bottom portion of the conductive structure.

In some embodiments, the semiconductor structure further includes removing the mask layer after forming the conductive structure.

In the aforementioned embodiments, since the mask layer is disposed above the first substrate and the sacrifice spacer is disposed on the sidewall of the first substrate, the area of the conductive structure can be decreased, thereby decreasing the integration density. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
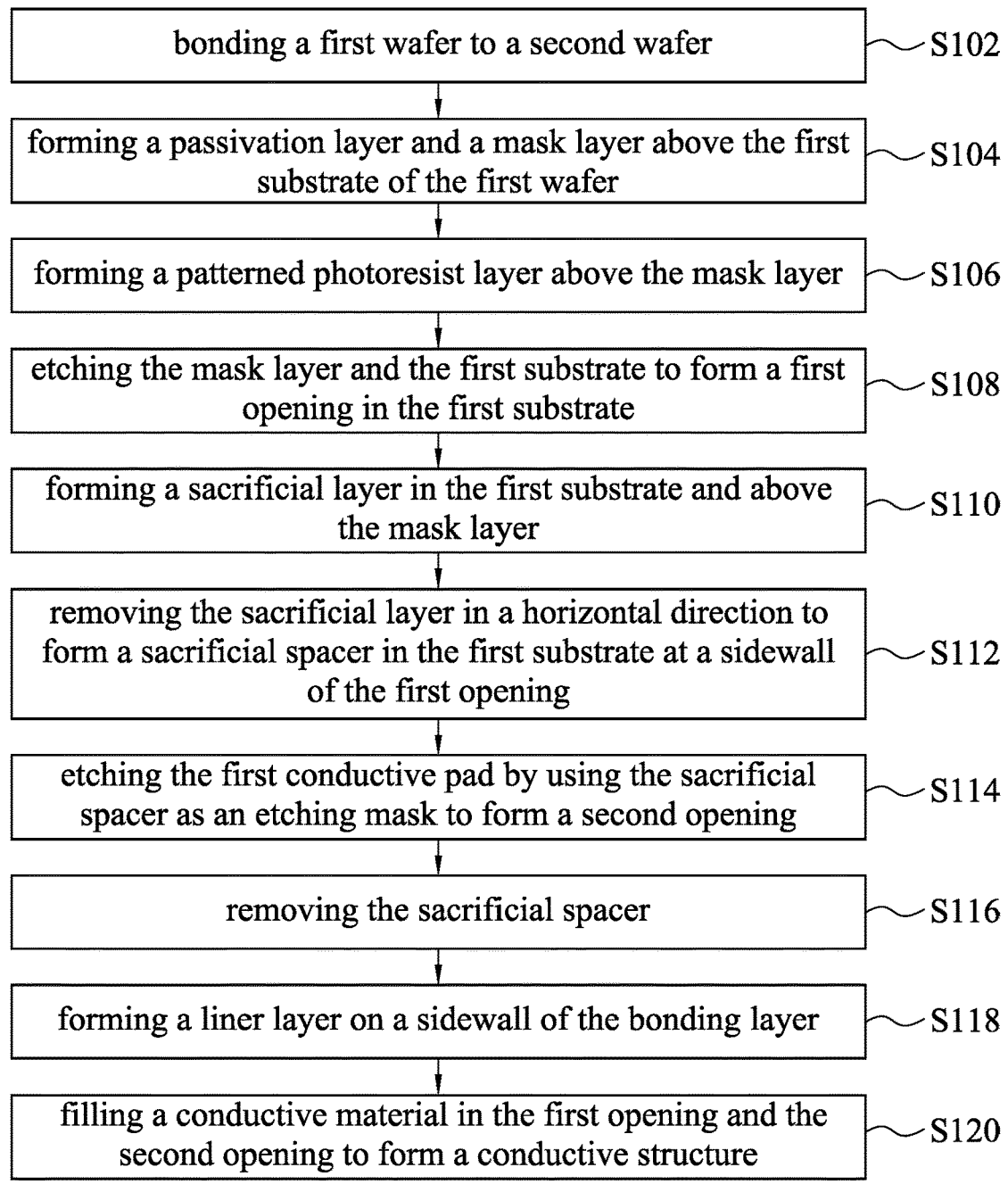
FIG. 1 is a flow chart illustrating a method of forming a semiconductor structure in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method 100 of forming a semiconductor structure 200 in accordance with some embodiments of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. FIGS. 2-12 are cross-sectional views illustrating the method 100 for forming the semiconductor structure 200 at various stages in accordance with some embodiments of the present disclosure. The semiconductor structure 200 may be a dynamic random access memory (DRAM) device.

Figure 2:
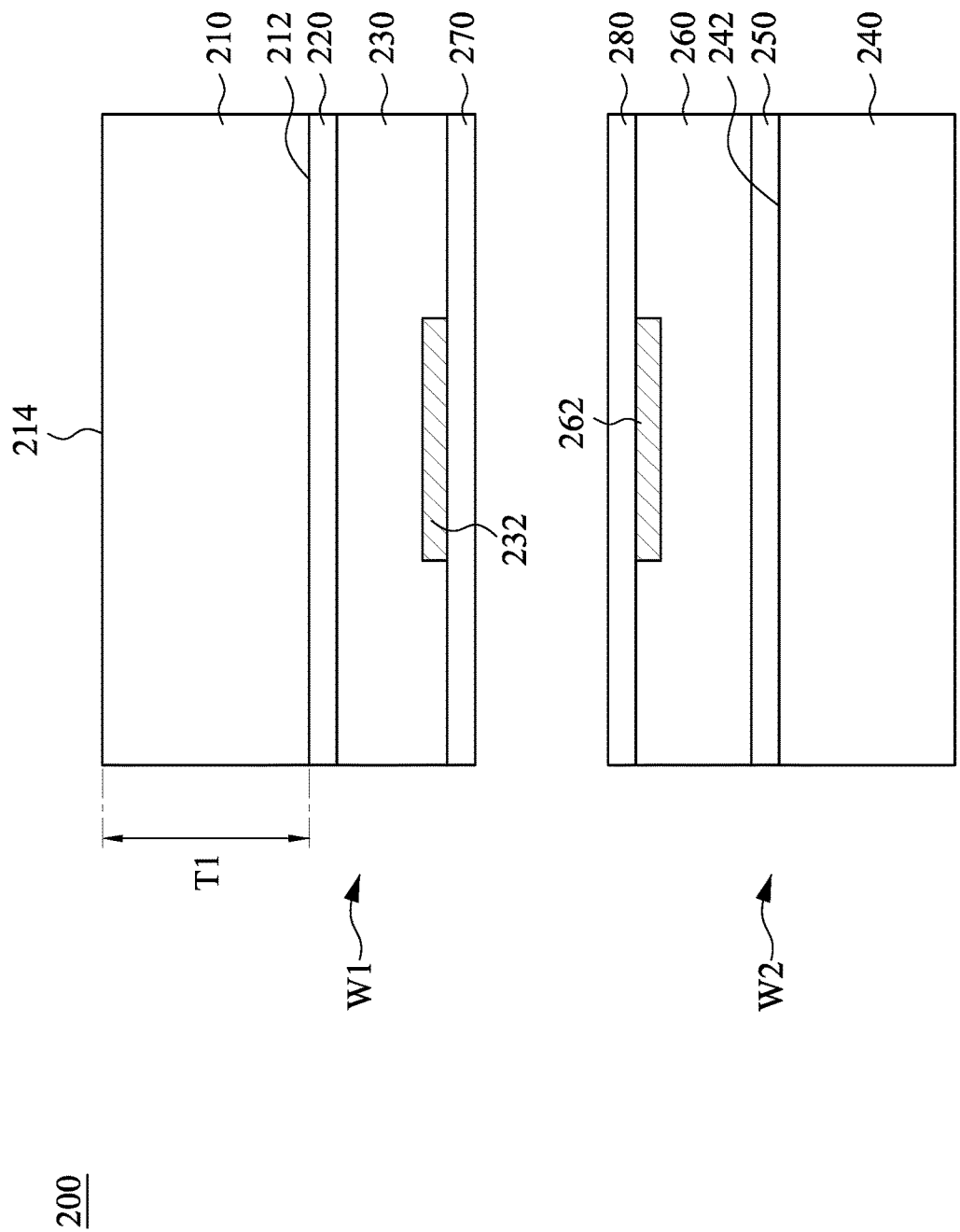
FIGS. 2-12 are cross-sectional views illustrating the method for forming the semiconductor structure at various stages in accordance with some embodiments of the present disclosure.
Figure 3:
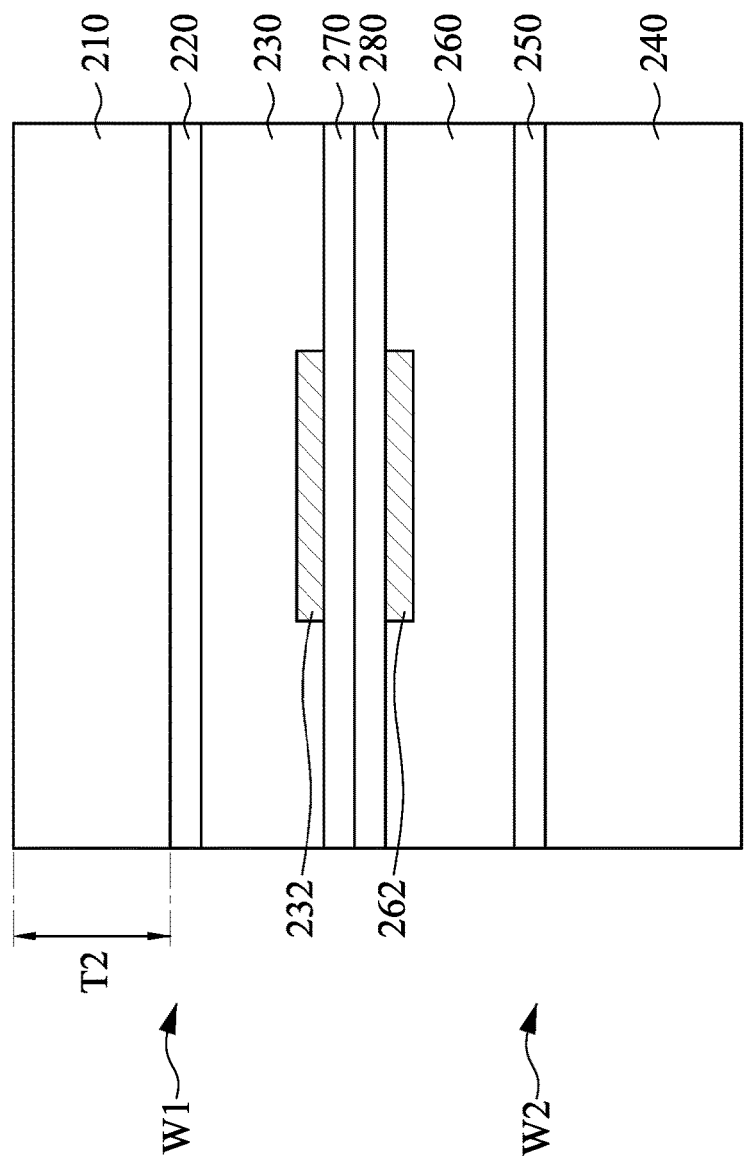

Referring to FIG. 1, FIG. 2 and FIG. 3, the method 100 begins with operation S102 in which a first wafer W1 is bonded to a second wafer W2. In greater detail, the first wafer W1 includes a first substrate 210, a first device layer 220 above a first surface 212 of the first substrate 210, and a first interconnect structure 230 above the first device layer 220 and the first substrate 210.

In some embodiments, the first substrate 210 includes an elementary semiconductor, such as germanium, or silicon; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the first device layer 220 includes one or more active and/or passive devices. For example, the active and/or passive devices may include various N-type metal-oxide semiconductor (NMOS) devices and/or P-type metal-oxide semiconductor (PMOS) devices, such as transistors, capacitors, resistors, diodes, photo-diodes, fuses, and the like. In some embodiment, the first interconnect structure 230 has at least one first conductive pad 232 above the first surface 212 of the first substrate 210. In greater details, the first interconnect structure 230 is connected to the active and/or passive devices of the first device layer 220. The first interconnect structure 230 may include a plurality of conductive lines that provide interconnections (wiring) between the active and/or passive devices of the first device layer 220, and between conductive lines themselves. The first interconnect structure 230 may include inter-metal dielectric (IMD) layers, and the conductive lines may be insulated from each other by the IMD layers. The first interconnect structure 230 may further include various conductive vias disposed within the IMD layers for connecting the conductive lines.

Similarly, the second wafer W2 includes a second substrate 240, a second device layer 250 above a second surface 242 of the second substrate 240, and a second interconnect structure 260 above the second device layer 250 and the second substrate 240. The second interconnect structure 260 has at least one second conductive pad 262 above the second surface 242 of the second substrate 240. In some embodiments, the first conductive pad 232 and the second conductive pad 262 includes the same materials, such as aluminum, copper, metal, or other suitable conductive materials. For example, the first conductive pad 232 and the second conductive pad 262 are aluminum conductive pads. In some embodiments, the first conductive pad 232 and the second conductive pad 262 includes different materials. For example, the first conductive pad 232 is an aluminum conductive pad, while the second conductive pad 262 is a copper conductive pad. In some embodiments, the first conductive pad 232 overlaps with the second conductive pad 262. Specifically, a vertical projection of the first conductive pad 232 on the second substrate 240 overlaps with a vertical projection of the second conductive pad 262 on the second substrate 240. In some embodiments, the "vertical" herein represents a stacking direction of the second substrate 240, the second device layer 250, and the second interconnect structure 260 and/or a stacking direction of the first substrate 210, the first device layer 220, and the first interconnect structure 230. It is noted that configurations and materials of the second substrate 240 of the second wafer W2 are similar to that of the first substrate 210, the configurations and materials of the second device layer 250 of the second wafer W2 are similar to that of the first device layer 220, and/or the configurations and materials of the second interconnect structure 260 of the second wafer W2 are similar to that of the first interconnect structure 230, and the descriptions thereof are not repeated hereinafter.

In some embodiments, the semiconductor structure 200 further includes a first bonding layer 270 in contact with the first conductive pad 232 of the first interconnect structure 230, and a second bonding layer 280 in contact with the second conductive pad 262 of the second interconnect structure 260. The first bonding layer 270 and the second bonding layer 280 may be made of silicon oxide ($SiO_2$), silicon nitride (SiN), silicon oxynitride (SiON), or other suitable materials. As shown in FIG. 3, the bonding layers (the first bonding layer 270 and the second bonding layer 280) are disposed between the wafer W1 and the wafer W2 for fusion bonding. However, embodiments of the present disclosure are not limited thereto. In some embodiments, the first wafer W1 is bonded on the second wafer W2 by an anodic bonding process or an adhesive bonding process.

After the first wafer W1 is bonded to the second wafer W2, the first substrate 210 of the first wafer W1 is thinned. For example, a thickness T1 of the first substrate 210 in FIG. 2 is greater than a thickness T2 of the first substrate 210 in FIG. 3. In some embodiments, a grinding process is performed on a surface 214 (see FIG. 2) opposite to the first surface 212 of the first substrate 210 to thin the first substrate 210.

Figure 4:
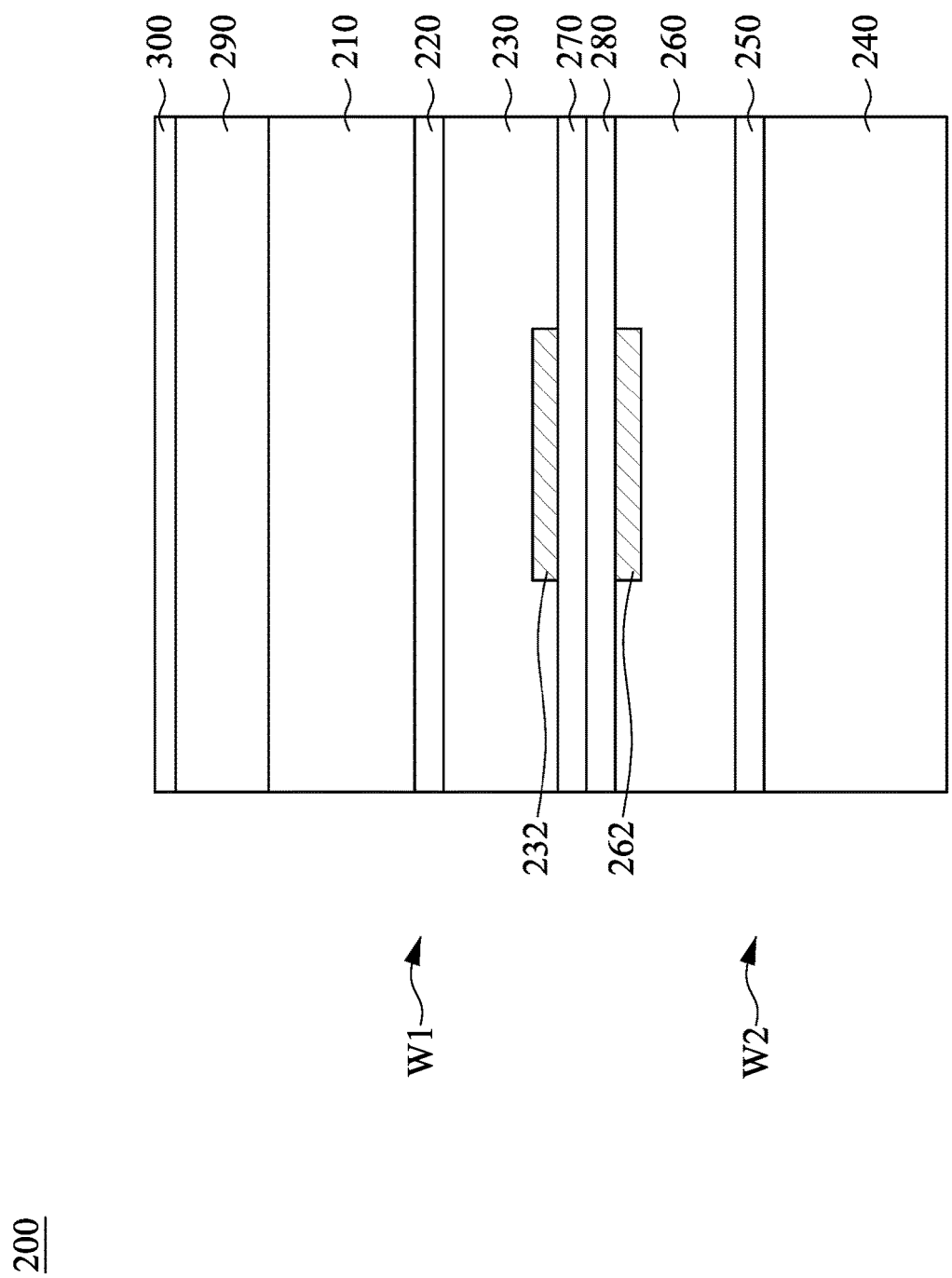

Referring to FIG. 1 and FIG. 4, the method 100 continues with operation S104 in which a passivation layer 290 and a mask layer 300 are formed above the first substrate 210 of the first wafer W1. In greater details, the passivation layer 290 is formed above the first substrate 210 of the first wafer W1, and then the mask layer 300 is formed above the passivation layer 290. The passivation layer 290 may be formed above the first substrate 210 of the first wafer W1 by deposition techniques, such as chemical vapor deposition (CVD), physical vapor deposition (PVD), or other suitable techniques. In some embodiments, the passivation layer 290 may be made of silicon oxide ($SiO_2$), silicon nitride (SiN), silicon oxynitride (SiON), or other suitable materials.

The mask layer 300 may be formed above the passivation layer 290 by suitable techniques, such as atomic layer deposition (ALD), chemical vapor deposition (CVD), physical vapor deposition (PVD), combinations thereof, or other suitable techniques. In some embodiments, the mask layer 300 is made of metal oxide, such as titanium oxide (TiOx), aluminum oxide (AlOx), hafnium oxide (HfOx), tantalum oxide (TaOx), tungsten oxide (WOx), or other suitable materials. In some other embodiments, the mask layer 300 is made of nitride materials, such as silicon nitride (SiN), silicon carbide nitride (SiCN), silicon carbide oxynitride (SiCON), silicon oxynitride (SiON), and has a high etching selectivity with respect to the passivation layer 290. Compared to oxide materials, a selectivity ratio of the nitride materials and the oxide materials may be about or greater than 10. In some embodiments, the mask layer 300 and the passivation layer 290 includes different materials, and thus the mask layer 300 can protect the underlying layers.

Figure 5:
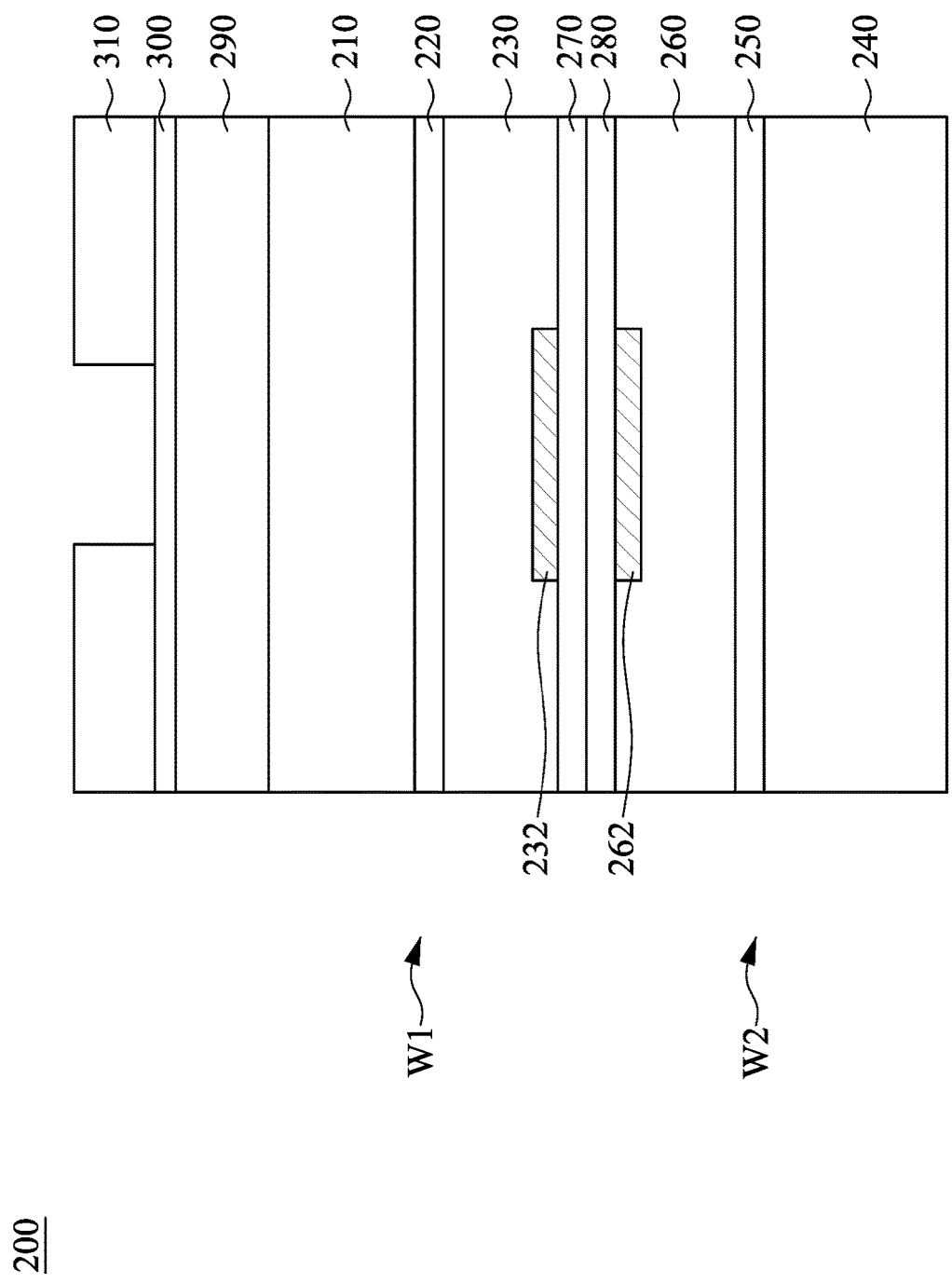

Referring to FIG. 1 and FIG. 5, the method 100 continues with operation S106 in which a patterned photoresist layer 310 is formed above the mask layer 300. In greater details, the patterned photoresist layer 310 is formed by forming a photoresist layer above the mask layer 300 and then patterning the photoresist layer into the patterned photoresist layer 310 by using suitable photolithography techniques. For example, after forming (e.g., spin-on coating) the photoresist layer onto the mask layer 300, the photoresist layer is exposed to a pattern of light radiation. In some embodiments, the patterned photoresist layer 310 covers a portion of the mask layer 300, and the other portions of the mask layer 300 are exposed.

Figure 6:
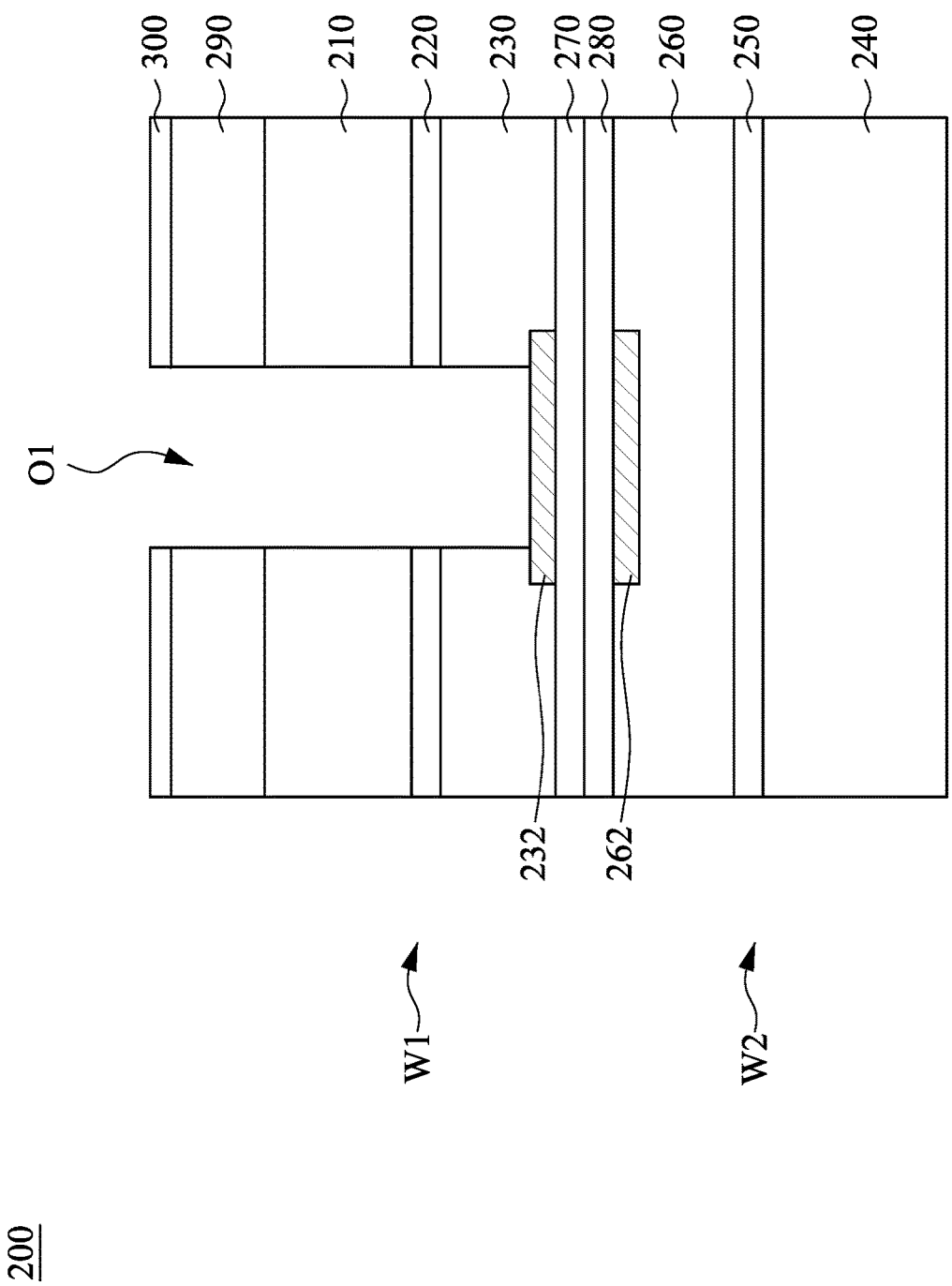

Referring to FIG. 1, FIG. 5 and FIG. 6, the method 100 continues with operation S108 in which the mask layer 300 and the first substrate 210 are etched to form a first opening O1 in the first substrate 210. In greater details, the mask layer 300, the passivation layer 290, and the first wafer W1 are etched to form the first opening O1 using the patterned photoresist layer 310 as an etch mask, such that the first conductive pad 232 is exposed through the first opening O1. In other words, sidewalls of the mask layer 300, the passivation layer 290, the first substrate 210, the first device layer 220, and a portion of the first interconnect structure 230 are exposed through the first opening O1.

Thereafter, the patterned photoresist layer 310 is removed. In some embodiments, removing the patterned photoresist layer 310 may be performed by using a photoresist strip process, such as an ashing process, and etching process, or other suitable processes.

Figure 7:
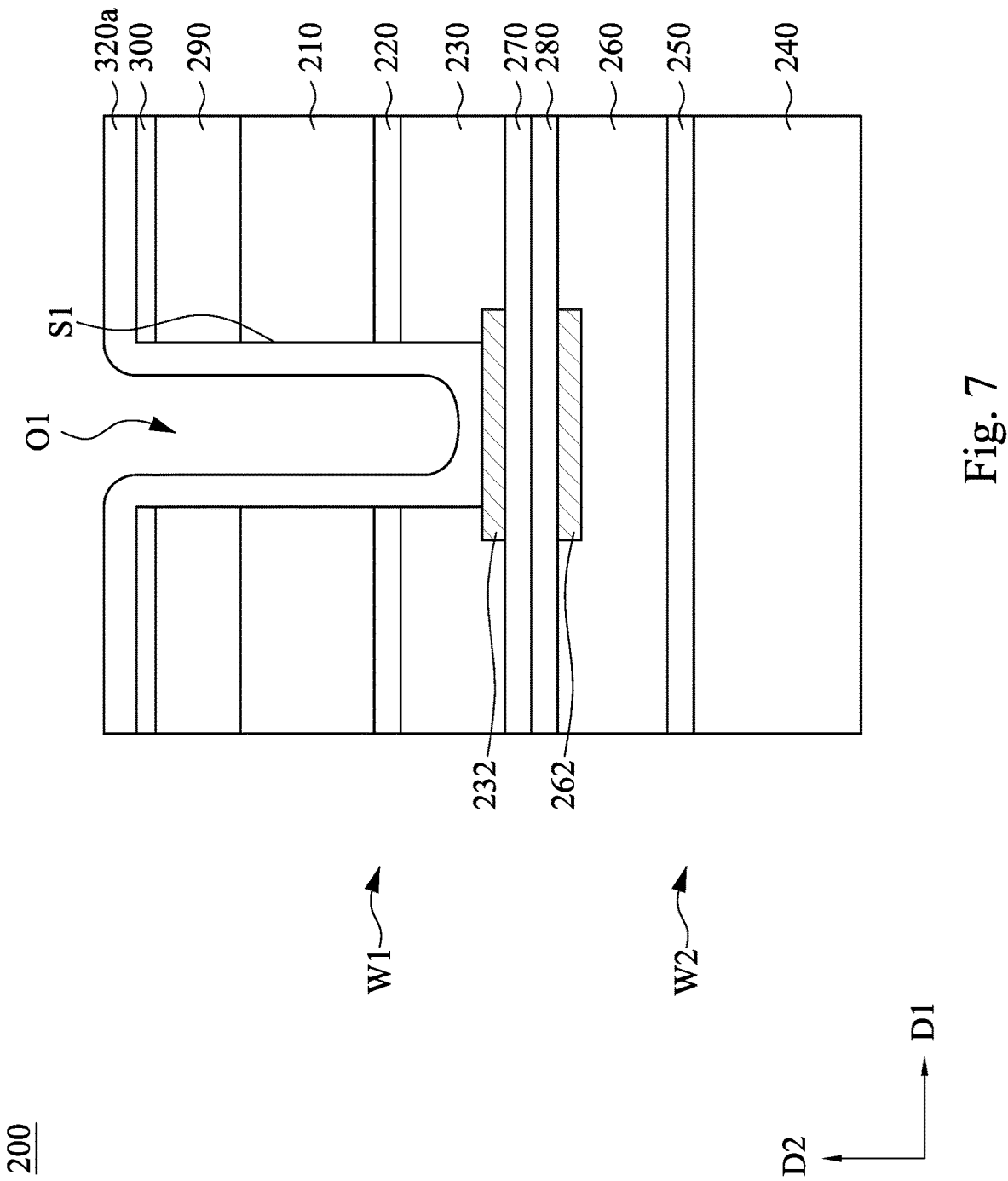

Referring to FIG. 1 and FIG. 7, the method 100 continues with operation S110 in which a sacrificial layer 320a is formed in the first substrate 210 and above the mask layer 300. In greater details, the sacrificial layer 320a is formed above the first conductive pad 232 and the mask layer 300, and the sacrificial layer 320a is further formed on the sidewalls of the mask layer 300, the passivation layer 290, the first substrate 210, the first device layer 220, and the first interconnect structure 230. In other words, the sacrificial layer 320a is formed in the first substrate 210 at a sidewall S1 and a bottom surface of the first opening O1. Stated differently, the sacrificial layer 320a is formed above the mask layer 300 and the first conductive pad 232 in a horizontal direction D1, and on the sidewall S1 of the first opening O1 (on the sidewalls of the mask layer 300, the passivation layer 290, the first substrate 210, the first device layer 220, and the first interconnect structure 230) in a vertical direction D2.

In some embodiments, the sacrificial layer 320a is formed in the first substrate 210 and above the mask layer 300 by using an atomic layer deposition (ALD), chemical vapor deposition (CVD), or other suitable processes. In some embodiments, the sacrificial layer 320a may be made of organic materials, such as polyimides, or other suitable materials.

Figure 8:
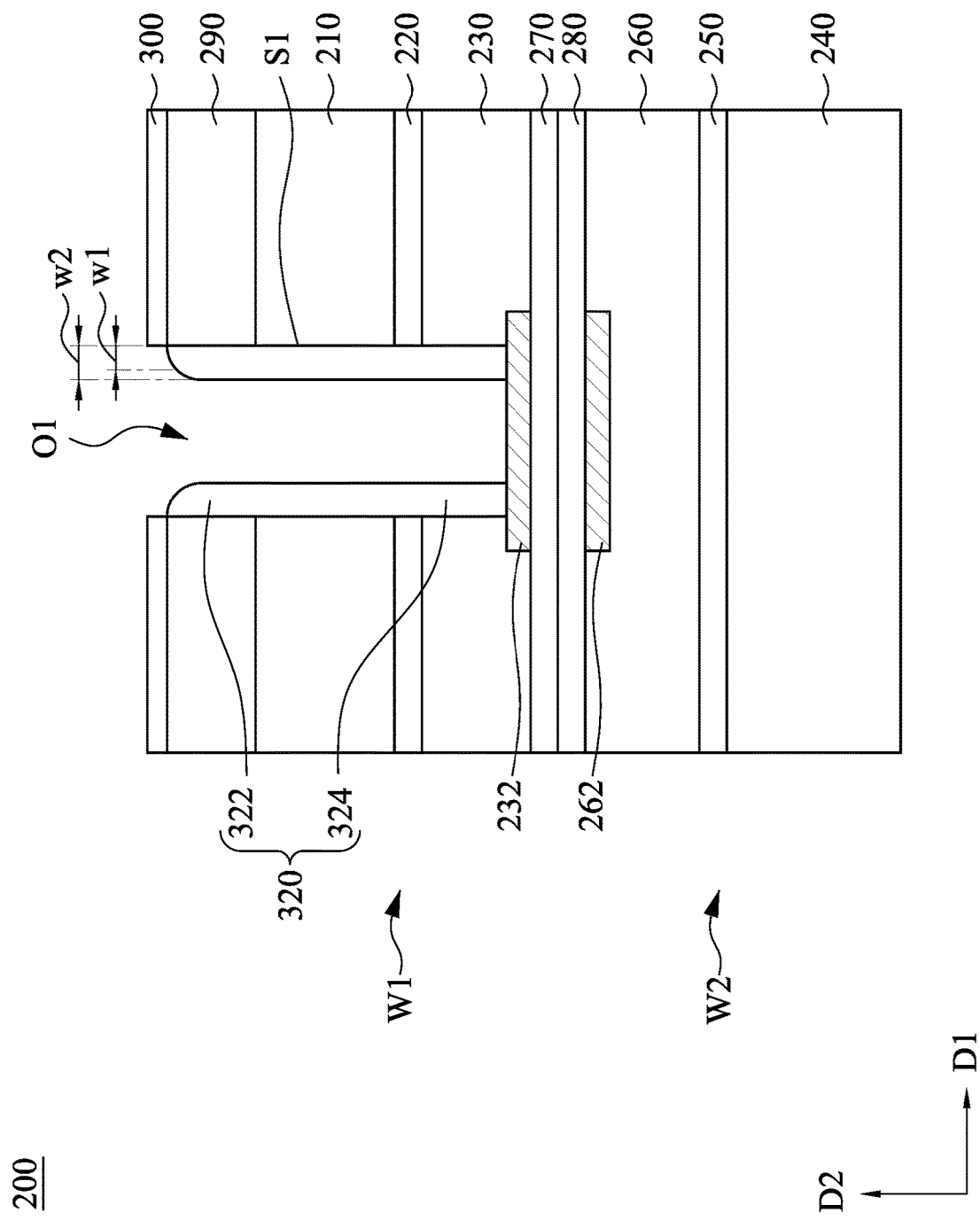

Referring to FIG. 1, FIG. 7, and FIG. 8, the method 100 continues with operation S112 in which the sacrificial layer 320a in the horizontal direction D1 is removed to form a sacrificial spacer 320 in the first substrate 210 at the sidewall S1 of the first opening O1. In other words, the sacrificial layer 320a in the horizontal direction D1 is removed, leaving the sacrificial layer 320a in the vertical direction D2 remained. The first conductive pad 232, the sidewall of the mask layer 300, and a top surface of the mask layer 300 are exposed. In some embodiments, the sacrificial spacer 320 is in contact with the first conductive pad 232, the first interconnect structure 230, the first device layer 220, the first substrate 210, and the passivation layer 290. In some embodiments, the sacrificial spacer 320 is spaced apart from the mask layer 300.

In some embodiments, the sacrificial spacer 320 has a top portion 322 in contact with the passivation layer 290 and a bottom portion 324 in contact with the first conductive pad 232. A width w1 of the top portion 322 of the sacrificial spacer 320 is smaller than a width w2 of the bottom portion 324 of the sacrificial spacer 320. In some embodiments, the top portion 322 of the sacrificial spacer 320 has a tapered shape. In some embodiments, removing the sacrificial layer 320a in the horizontal direction D1 is performed by using an anisotropic etching process, such that the top portion 322 of the sacrificial spacer 320 has a round-shape profile.

Figure 9:
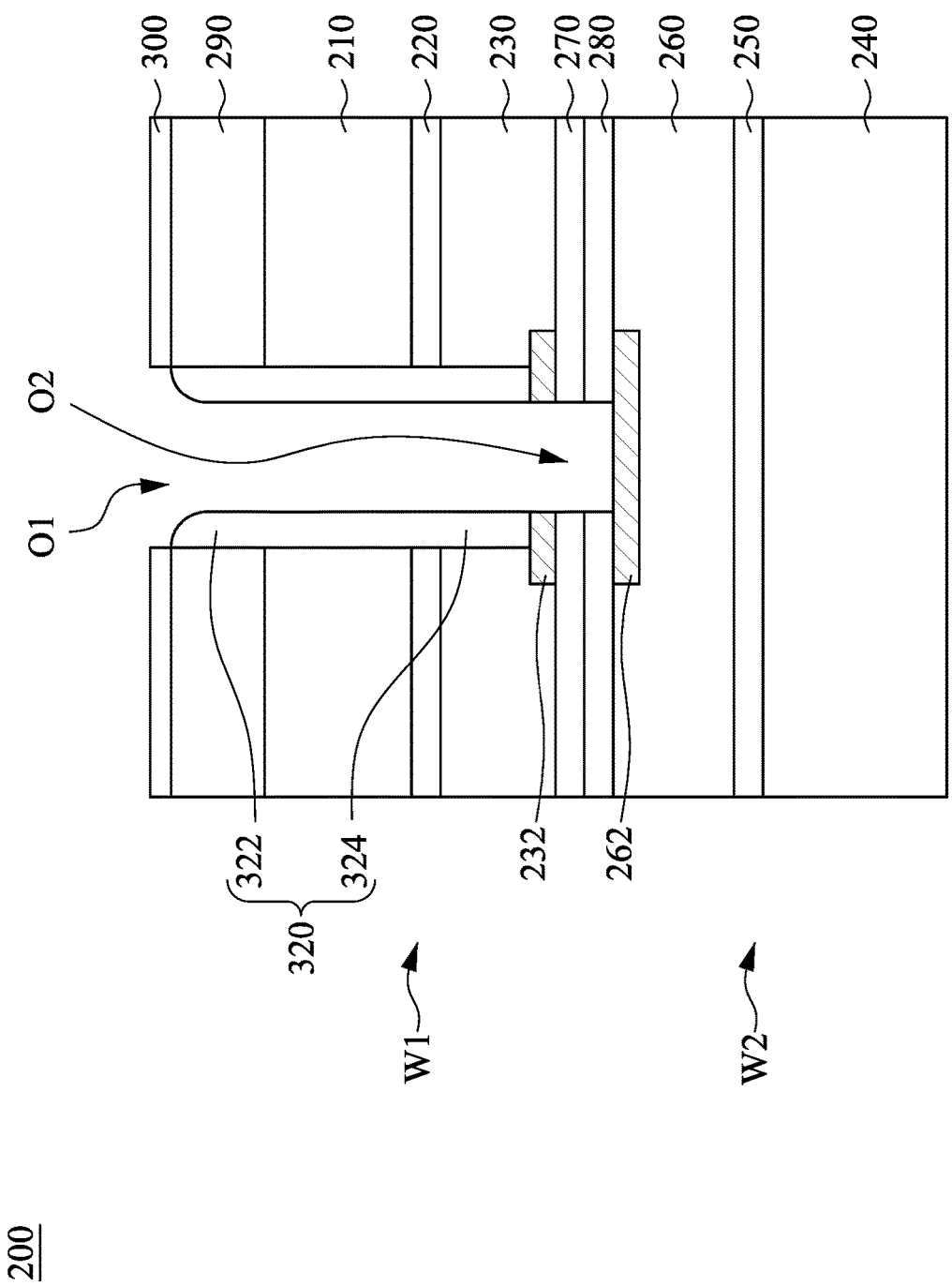

Referring to FIG. 1 and FIG. 9, the method 100 continues with operation S114 in which the first conductive pad 232 is etched by using the sacrificial spacer 320 as an etching mask to form a second opening O2 communicated to the first opening O1, such that the first bonding layer 270 is exposed. Thereafter, the first bonding layer 270 and the second bonding layer 280 are etched by using the sacrificial spacer 320 as the etching mask such that the second conductive pad 262, a sidewall of the first bonding layer 270, and a sidewall of the second bonding layer 280 are expose through the second opening O2.

In some embodiments, the mask layer 300 can protect the underlying passivation layer 290 during the aforementioned etching processes (etching the first conductive pad 232, the first bonding layer 270, and the second bonding layer 280).

Figure 10:
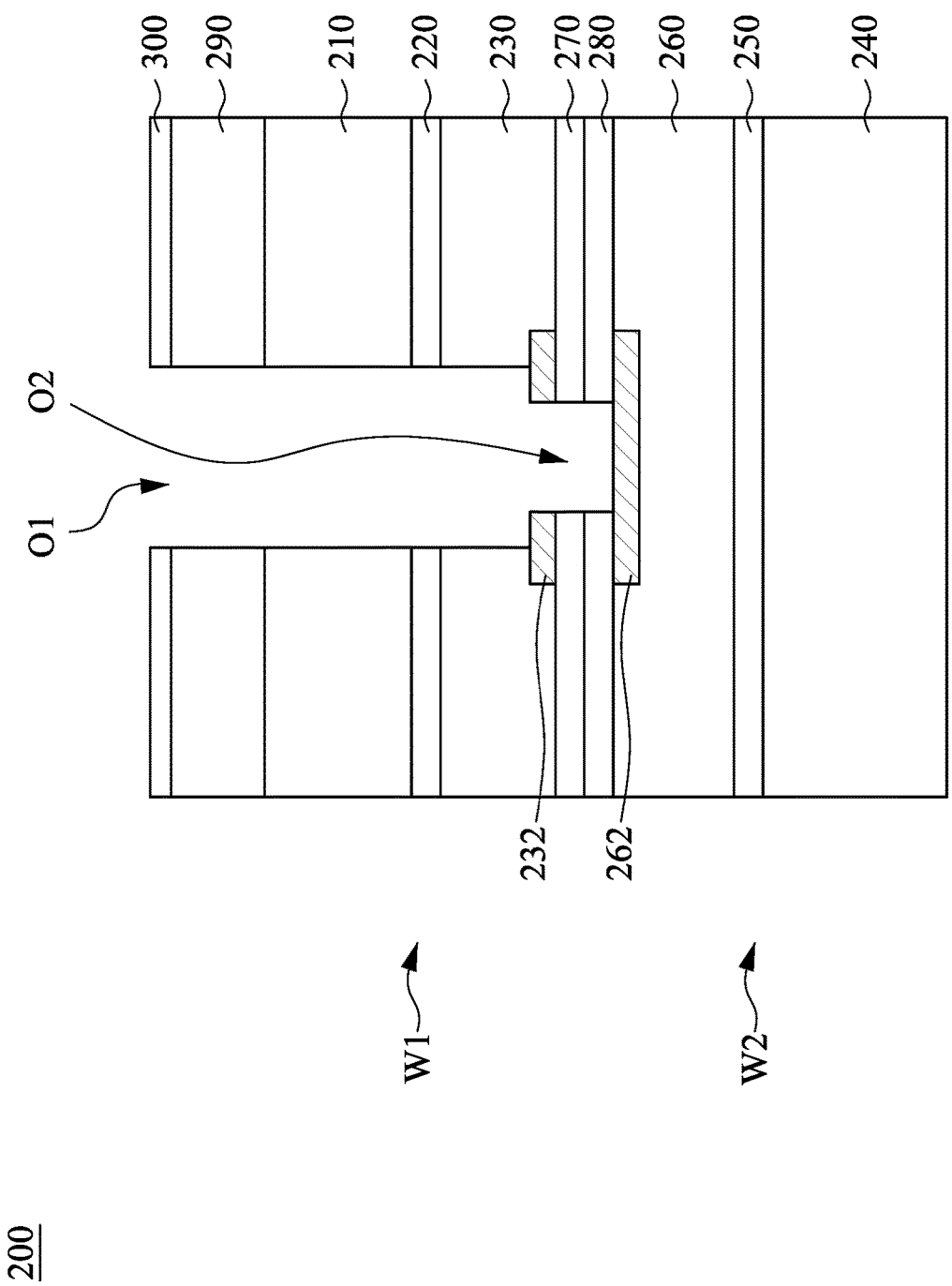

Referring to FIG. 1, FIG. 9, and FIG. 10, the method 100 continues with operation S116 in which the sacrificial spacer 320 is removed such that the sidewalls of the passivation layer 290, the first substrate 210, the first device layer 220, and the first interconnect structure 230 are exposed. Furthermore, a portion of a top surface of the first conductive pad 232 is exposed. In some embodiments, since the sacrificial spacer 320 and the passivation layer 290 are made of different materials (and/or have high etching selectivity), during the etching process, the sacrificial spacer 320 is removed, leaving the passivation layer 290 is remained or barely removed. For example, the sacrificial spacer 320 is made of organic materials, and the passivation layer 290 is made of oxide materials.

In some embodiments, the sacrificial spacer 320 is removed by performing a chemical etching process, such as a dry etching process. For example, a reactive ion etching (RIE) process using oxygen ($O_2$) as an etchant is performed to remove the sacrificial spacer 320, followed by a clean treatment to remove remaining particles.

Figure 11:
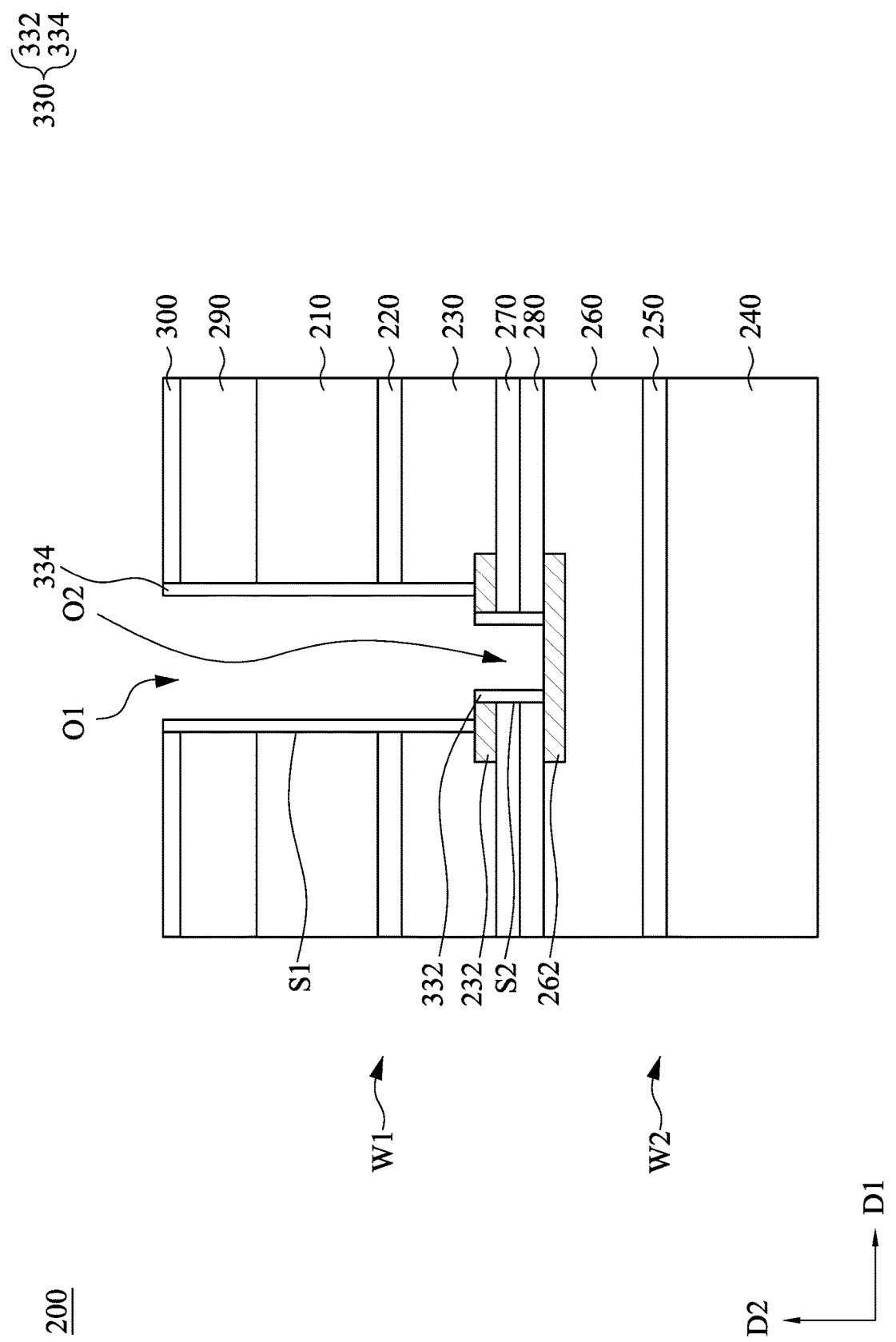

Referring to FIG. 1 and FIG. 11, the method 100 continues with operation S118 in which a liner layer 330 is formed on the sidewalls of the first bonding layer 270 and the second bonding layer 280. In greater details, the liner layer 330 is formed above the first conductive pad 232 and the second conductive pad 262 in the horizontal direction D1, and on the sidewall S1 of the first opening O1 and a sidewall S2 of the second opening O2 in the vertical direction D2. Thereafter, the liner layer 330 in the horizontal direction D1 is removed by an anisotropic etching process, leaving the liner layer 330 in the vertical direction D2 remained. The liner layer 330 can protect the first substrate 210 from getting damage by following metal deposition process.

In other words, the liner layer 330 includes a first portion 332 and a second portion 334 above the first portion 332. The first portion 332 of the liner layer 330 is formed on the sidewalls of the first bonding layer 270 and the second bonding layer 280, and the first portion 332 of the liner layer 330 is in contact with the first conductive pad 232, the first bonding layer 270, the second bonding layer 280, and the second conductive pad 262. The second portion 334 of the liner layer 330 is formed on the sidewalls of the mask layer 300, the passivation layer 290, the first substrate 210, the first device layer 220, and the first interconnect structure 230, and the second portion 334 of the liner layer 330 is in contact with the first conductive pad 232, while spaced apart from the second conductive pad 262. In some embodiments, the first portion 332 of the liner layer 330 is in contact with a sidewall of the first conductive pad 232, and the second portion 334 of the liner layer 330 is in contact with a top surface of the first conductive pad 232.

In some embodiments, the liner layer 330 is formed using chemical vapor deposition (CVD), atomic layer deposition (ALD), other suitable processes, or combinations thereof. In some embodiments, the liner layer 330 is made of dielectric materials. For example, the liner layer 330 is made of oxide materials, such as silicon oxide ($SiO_2$), or other suitable materials.

Figure 12:
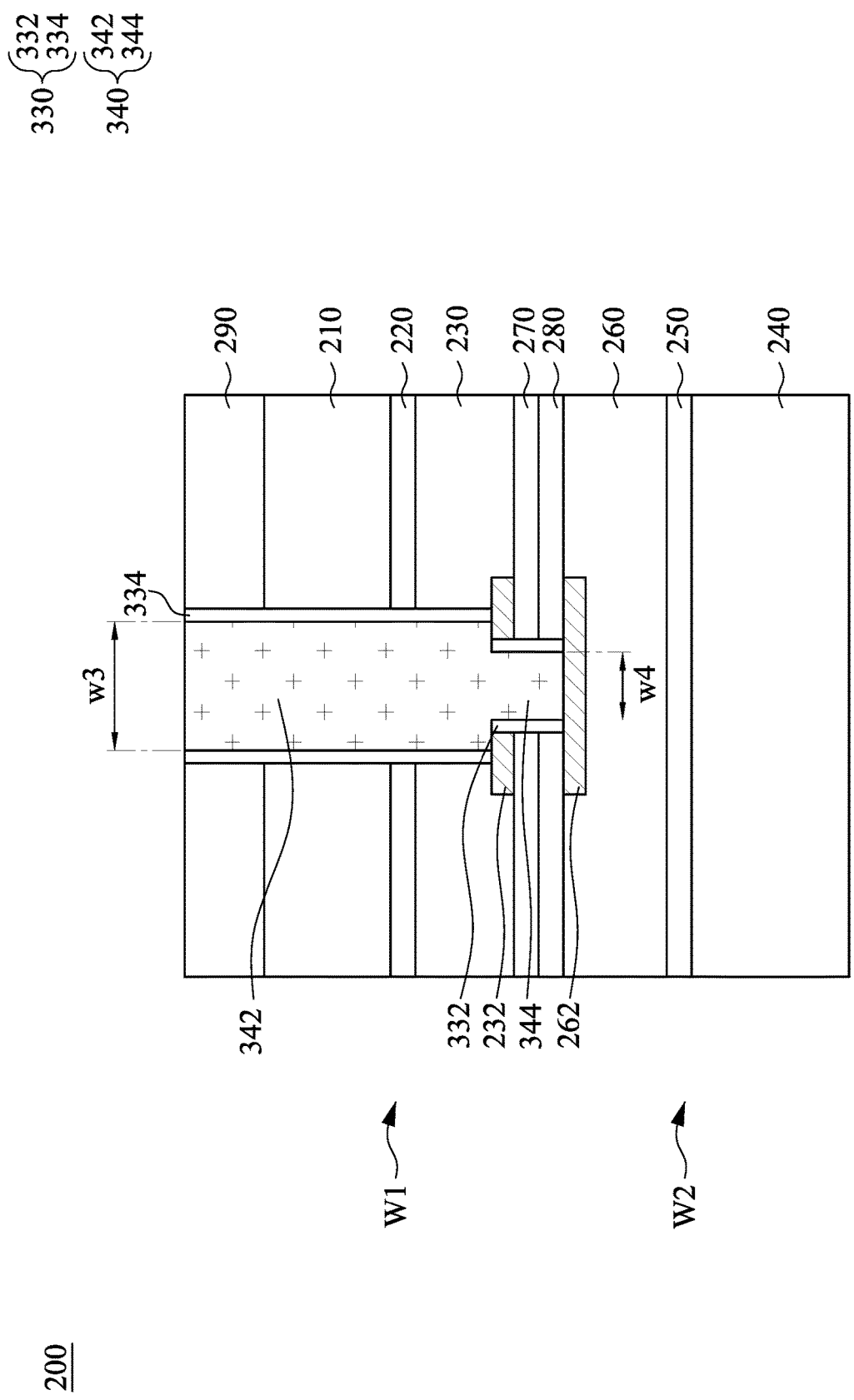

Referring to FIG. 1, FIG. 11, and FIG. 12, the method 100 continues with operation S120 in which a conductive material is filled in the first opening O1 and the second opening O2 to form a conductive structure 340. Thereafter, a planarization process is performed to remove excess materials. In greater details, the mask layer 300 and a portion of the conductive structure 340 are removed by the planarization process, such as a chemical mechanical polishing (CMP).

In some embodiments, the conductive structure 340 is formed in the first substrate 210 of the first wafer W1 and extending upward from the second conductive pad 262. The conductive structure 340 has a top portion 342 in contact with the first conductive pad 232 and the bottom portion 344 in contact with the second conductive pad 262. As such, the conductive structure 340 electrically interconnects the first conductive pad 232 and the second conductive pad 262. A width w3 of the top portion 342 of the conductive structure 340 is greater than a width w4 of the bottom portion 344 of the conductive structure 340. In some embodiments, an area of the top portion 342 of the conductive structure 340 is greater than an area of the bottom portion 344 of the conductive structure 340.

In some embodiments, the liner layer 330 and the conductive structure 340 is referred as a single through-substrate via. Compared to multiple through-substrate vias (e.g., two through-substrate via connected with each other), the total area of the conductive structure 340 can be decreased, thereby decreasing the integration density. Furthermore, the manufacturing process (e.g, forming the first opening O1 and the second opening O2) can be simplified. As a result, the performance of the semiconductor structure 200 can be improved.

In some embodiments, the first bonding layer 270 and the second bonding layer 280 laterally surround the bottom portion 344 of the conductive structure 340. In some embodiments, the conductive structure 340 covers a top surface of the first portion 332 of the liner layer 330. In some embodiments, the first conductive pad 232 laterally surrounds the bottom portion 344 of the conductive structure 340. Further, the bottom surface of the bottom portion 344 of the conductive structure 340 is lower than the bottom surface of the first conductive pad 232. Moreover, the conductive structure 340 overlaps with the first conductive pad 232 and the second conductive pad 234. Specifically, a vertical projection of the conductive structure 340 on the second substrate 240 overlaps with the vertical projection of the first conductive pad 232 on the second substrate 240 and the vertical projection of the second conductive pad 262 on the second substrate 240. In addition, the conductive structure 340 is in contact with both the top surface of the first conductive pad 232 and the top surface of the second conductive pad 234.

In some embodiments, the conductive structure 340 may be formed by chemical vapor deposition (CVD), physical vapor deposition (PVD), atomic layer deposition (ALD), or other suitable processes. The conductive structure 340 may be made of metal, such as copper (Cu), iron (Fe), aluminum (Al), or other suitable conductive materials.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:
    bonding a first wafer to a second wafer, wherein the first wafer comprises a first substrate and a first conductive pad above a first surface of the first substrate, and wherein the second wafer comprises a second substrate and a second conductive pad above a second surface of the second substrate;
    forming a mask layer above the first substrate;

etching the mask layer and the first substrate to form a first opening in the first substrate, such that the first conductive pad is exposed through the first opening;

forming a sacrificial spacer in the first substrate at a sidewall of the first opening, wherein forming the sacrificial spacer is performed such that the mask layer is spaced apart from the sacrificial spacer;

etching the first conductive pad by using the sacrificial spacer as an etching mask to form a second opening communicated to the first opening, such that the second conductive pad is exposed through the second opening; and filling a conductive material in the first opening and the second opening to form a conductive structure interconnecting the first and second conductive pads.

2. The method of forming the semiconductor structure of claim 1, further comprising:

prior to forming the mask layer, forming a passivation layer over the first substrate.

3. The method of forming the semiconductor structure of claim 2, wherein the mask layer and the passivation layer comprise different materials.

4. The method of forming the semiconductor structure of claim 1, wherein the mask layer is made of metal oxide.

5. The method of forming the semiconductor structure of claim 1, wherein forming the sacrificial spacer is performed such that the first conductive pad is exposed.

6. The method of forming the semiconductor structure of claim 1, wherein forming the sacrificial spacer is performed such that a top portion of the sacrificial spacer has a width smaller than that of a bottom portion of the sacrificial spacer.

7. The method of forming the semiconductor structure of claim 1, wherein forming the sacrificial spacer is performed such that the sacrificial spacer is in contact with the first conductive pad.

8. The method of forming the semiconductor structure of claim 1, wherein the sacrificial spacer is made of an organic material.

9. The method of forming the semiconductor structure of claim 1, further comprises:

prior to forming the conductive structure, removing the sacrificial spacer such that the sidewall of the first substrate is exposed.

10. The method of forming the semiconductor structure of claim 1, wherein etching the first conductive pad to form the second opening further comprising etching a bonding layer between the first conductive pad and the second conductive pad.

11. The method of forming the semiconductor structure of claim 10, further comprising:

forming a liner layer on a sidewall of the bonding layer.

12. The method of forming the semiconductor structure of claim 1, wherein forming the conductive structure is performed such that a top portion of the conductive structure is in contact with the first conductive pad and a bottom portion of the conductive structure is in contact with the second conductive pad.

13. The method of forming the semiconductor structure of claim 12, wherein the top portion of the conductive structure has a width greater than that of the bottom portion of the conductive structure.

14. The method of forming the semiconductor structure of claim 1, further comprising:

after forming the conductive structure, removing the mask layer.

15. A method of forming a semiconductor structure, comprising:

bonding a first wafer to a second wafer, wherein the first wafer comprises a first substrate and a first conductive pad above a first surface of the first substrate, and wherein the second wafer comprises a second substrate and a second conductive pad above a second surface of the second substrate;

forming a mask layer above the first substrate;

etching the mask layer and the first substrate to form a first opening in the first substrate, such that the first conductive pad is exposed through the first opening;

forming a sacrificial spacer in the first substrate at a sidewall of the first opening;

etching the first conductive pad by using the sacrificial spacer as an etching mask to form a second opening communicated to the first opening, such that the second conductive pad is exposed through the second opening;

filling a conductive material in the first opening and the second opening to form a conductive structure interconnecting the first and second conductive pads; and prior to forming the conductive structure, removing the sacrificial spacer such that the sidewall of the first substrate is exposed.

16. A method of forming a semiconductor structure, comprising:

bonding a first wafer to a second wafer, wherein the first wafer comprises a first substrate and a first conductive pad above a first surface of the first substrate, and wherein the second wafer comprises a second substrate and a second conductive pad above a second surface of the second substrate;

forming a mask layer above the first substrate;

etching the mask layer and the first substrate to form a first opening in the first substrate, such that the first conductive pad is exposed through the first opening;

forming a sacrificial spacer in the first substrate at a sidewall of the first opening;

etching the first conductive pad by using the sacrificial spacer as an etching mask to form a second opening communicated to the first opening, such that the second conductive pad is exposed through the second opening;

filling a conductive material in the first opening and the second opening to form a conductive structure interconnecting the first and second conductive pads; and after forming the conductive structure, removing the mask layer.

* * * * *